United States Patent
Hailu et al.

(10) Patent No.: US 10,419,204 B2
(45) Date of Patent: Sep. 17, 2019

(54) SERIALIZER-DESERIALIZER WITH FREQUENCY DOUBLER

(71) Applicant: QUALCOMM Incorporated, San Diego, CA (US)

(72) Inventors: Eskinder Hailu, Cary, NC (US); Bupesh Pandita, Raleigh, NC (US); Zhuo Gao, Austin, TX (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/990,517

(22) Filed: May 25, 2018

(65) Prior Publication Data
US 2019/0013929 A1  Jan. 10, 2019

Related U.S. Application Data

(60) Provisional application No. 62/529,665, filed on Jul. 7, 2017.

(51) Int. Cl.
| | | |
|---|---|---|
| H03D 3/24 | (2006.01) | |
| H04L 7/033 | (2006.01) | |
| G06F 1/10 | (2006.01) | |
| H03K 5/00 | (2006.01) | |
| H03L 7/16 | (2006.01) | |

(52) U.S. Cl.
CPC .............. *H04L 7/0331* (2013.01); *G06F 1/10* (2013.01); *H03K 5/00006* (2013.01); *H03L 7/16* (2013.01)

(58) Field of Classification Search
CPC ..... H04L 7/0331; G06F 1/10; H03K 5/00006; H03L 7/16

USPC .......................................................... 375/376
See application file for complete search history.

(56) References Cited

U.S. PATENT DOCUMENTS

| | | | |
|---|---|---|---|
| 6,211,741 B1 | 4/2001 | Dalmia | |
| 7,656,984 B2 | 2/2010 | Kim et al. | |
| 8,497,708 B2 | 7/2013 | Mukherjee et al. | |
| 8,707,078 B2 | 4/2014 | Mobin | |
| 9,588,860 B2 | 3/2017 | Gorzkiewicz et al. | |
| 2004/0071227 A1 | 4/2004 | Lee | |
| 2006/0008041 A1* | 1/2006 | Kim | H03L 7/0812 375/371 |
| 2009/0279895 A1* | 11/2009 | Takahara | G06F 7/68 398/98 |
| 2010/0183108 A1 | 7/2010 | Shin | |

FOREIGN PATENT DOCUMENTS

EP  2575001 A2  4/2013

OTHER PUBLICATIONS

International Search Report and Written Opinion—PCT/US2018/034953—ISA/EPO—dated Aug. 27, 2018.

* cited by examiner

*Primary Examiner* — Tanmay K Shah
(74) *Attorney, Agent, or Firm* — Haynes and Boone, LLP (36340)

(57) ABSTRACT

A quarter-rate clock signal is doubled in a frequency doubler to produce a half-rate clock signal used by a serializer/deserializer (SerDes) interface to serialize and deserialize data.

10 Claims, 4 Drawing Sheets

SERIALIZER-DESERIALIZER WITH FREQUENCY DOUBLER

CROSS-REFERENCE TO RELATED APPLICATION

This application claims priority to and the benefit of U.S. Provisional Application No. 62/529,665 filed Jul. 7, 2017.

TECHNICAL FIELD

This application relates to communication, and more particularly to a serializer-deserializer architecture including a frequency doubler.

BACKGROUND

Low-speed transmission of multi-bit words typically occurs over multi-wire buses with the bits for each multi-bit word being transmitted in parallel. For example, an eight-bit word may be transmitted over a bus having eight wires, one for each bit. But in such conventional buses, each bit carried on a given wire is independent of the remaining bits. As the data rates increase, the parallel data communication becomes problematic in that the various bits in a word become skewed from each other as the word propagates over the bus.

Given the issues with skew between multiple bits in high-speed communication, various serializer/deserializer (SerDes) systems have been developed. A SerDes transmitter serializes a multi-bit word into a series of corresponding bits for transmission to a receiver. There can then be now skew due to the serial transmission (although there may be multiple SerDes transmitters arranged in parallel with each SerDes transmitter transmitting over its serial data stream). The SerDes receiver deserializes the received serial bit stream into the original word.

SerDes systems may be either source synchronous or use an embedded clock. In a source synchronous system, the SerDes transmitter is associated with a SerDes clock transmitter for transmitting a clock signal with the serialized data stream. A SerDes receiver in a source synchronous system thus does not need to recover an embedded clock signal from the data using a clock data recovery (CDR) circuit. However, a source synchronous SerDes receiver still includes a CDR circuit that uses a local clock signal to align the received clock signal with the data eye for the received serial data stream. The receiver, transmitter, and clock transmitter in a source synchronous SerDes system thus all require a local clock signal for their operation.

An example source synchronous SerDes system 100 is shown in FIG. 1. A phase-locked loop (PLL) 105 generates a half-rate clock signal and its inverse in both in-phase (I) and quadrature (Q) forms such that the half-rate clock signal has four phases such as 0 degrees, 90 degrees, 180 degrees and 270 degrees. A transmitter (TX) 110 serializes a data stream for transmission responsive to two of the half-rate clock phases. In particular, transmitter 110 samples a parallel data stream being serialized responsive to a first clock edge (rising or falling) of the half-rate clock signal Transmitter 110 also samples the parallel data stream responsive to the same type of edge (the second edge being a rising edge if the first edge was rising and being a falling edge if the first edge was falling) of the inverse of the half-rate clock signal. It will be appreciated that transmitter 110 could perform this serialization using just one half-rate clock signal if it sampled responsive to both clock edges. Similarly, a clock transmitter (TX (CLK)) 120 generates the data clock signal responsive to the half-rate clock signal and its inverse. In contrast, a receiver (RX) 115 uses all four phases of the half-rate clock signal in its CDR circuit (not illustrated) as noted above so that the resulting aligned clock signal from the CDR circuit may be used to sample the received serial data stream to produce a parallel (de-serialized) data stream.

The data rate for the serialized data stream transmitted by transmitter 110 and de-serialized by receiver 115 is twice the half-rate clock frequency for PLL 105. Thus, if the data rate is 10 GHz, the half-rate clock frequency is 5 GHz. But as the data rate is increased, operation of system 100 becomes problematic. In particular, note that PLL 105 and transmitters 110 and 115 as well as receiver 120 may be widely separated on an integrated circuit die such as for a system-on-a-chip (SoC). The four phases of the half-rate clock signal must thus travel on respective leads (e.g., a trace in a metal layer) from PLL 105 to receiver 115. Similarly, two of the phases of the half-rate clock signal must travel on respective leads from PLL 105 to transmitters 110 and 120. These transmission lines may extend for as much as a millimeter or more across the SoC die. Should the data rate increase to 20 GHz, the various phases of the 10 GHz half-rate clock signal will tend to skew unacceptably with respect to each other as they propagate down such relatively long transmission lines. In addition, parasitic capacitance for such relatively long transmission lines may cause unacceptably high loss of the clock signal. Moreover, even if skew can be maintained within acceptable limits, PLL 105 will tend to consume substantial power at such elevated clocking rates. These issues of skew and power consumption are also present for embedded clock SerDes systems since their transmitters also need a half-rate clock signal.

Accordingly, there is a need in the art for high-data-rate SerDes architectures with reduced skew and power consumption.

SUMMARY

A clock source is provided that transmits a quarter-rate clock signal to a frequency doubler. The frequency doubler doubles the quarter-rate clock signal into a half-rate clock signal used by a SerDes to serialize and deserialize data. In this fashion, the problems of clock skew in the transmission of the quarter-rate clock signal from the clock source to the SerDes is solved by the relatively low frequency for the quarter-rate clock signal. Moreover, power consumption is reduced by the resulting relatively low frequency clock generation and transmission.

These and other advantageous features may be better appreciated through the following detailed description.

DETAILED DESCRIPTION

A quarter-rate clock source for a SerDes architecture is provided in which a serializer transmitter includes a frequency doubler that receives a quarter-rate clock signal and its quadrature from the quarter-rate clock source to generate a half-rate clock signal for serializing a parallel input data stream into a serial data stream. Should the serializer transmitter sample the parallel input data stream on both edges of the half-rate clock signal, no further phases for the quarter-rate clock signal are necessary. However, if the transmitter samples only on one type of clock edge (e.g., only on rising edges or only on falling edges), the frequency doubler receives not only the quarter-rate clock signal and its quadrature but also an inverse of the quarter-rate clock signal and its quadrature so that the resulting four-phase frequency doubler may produce a half-rate clock signal and its inverse. The transmitter may then sample only on one type of clock edge responsive to the half-rate clock signal and sample on the same type of clock edge responsive to the inverse of the half-rate clock signal to serialize the parallel input data stream. The following discussion will be directed to a four-phase frequency doubler implementation without loss of generality in that it will be appreciated that a two-phase frequency doubler may be used in alternative implementations. In addition, the following discussion will be directed to a source synchronous architecture but it will be appreciated that the advantages of doubling of a quarter-rate clock signal in a frequency doubler for a SerDes system may also be gained by the serializer transmitter in an embedded clock SerDes architecture.

Figure 1:
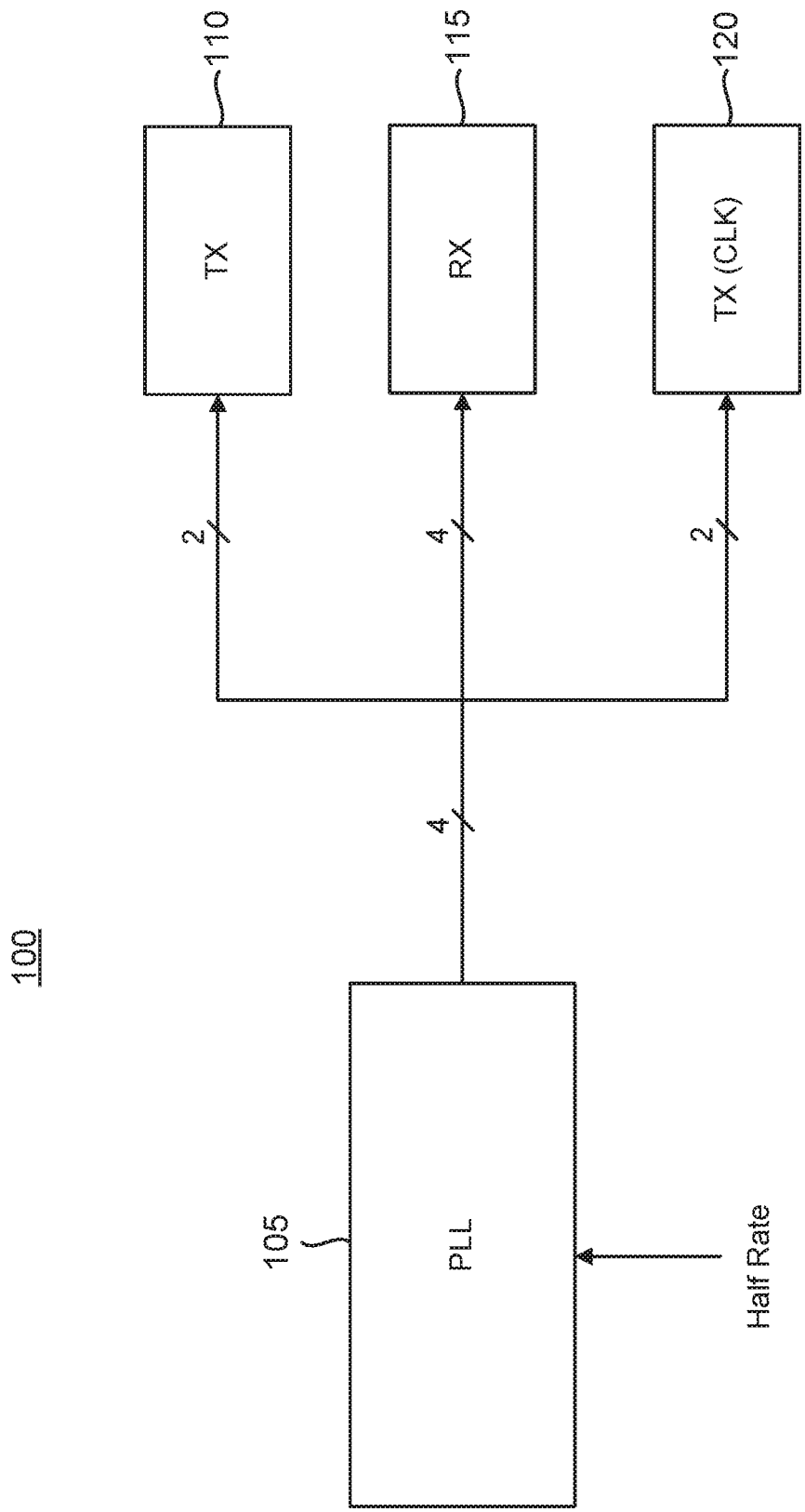
FIG. 1 is a diagram of a conventional source synchronous SerDes architecture.
Figure 2:
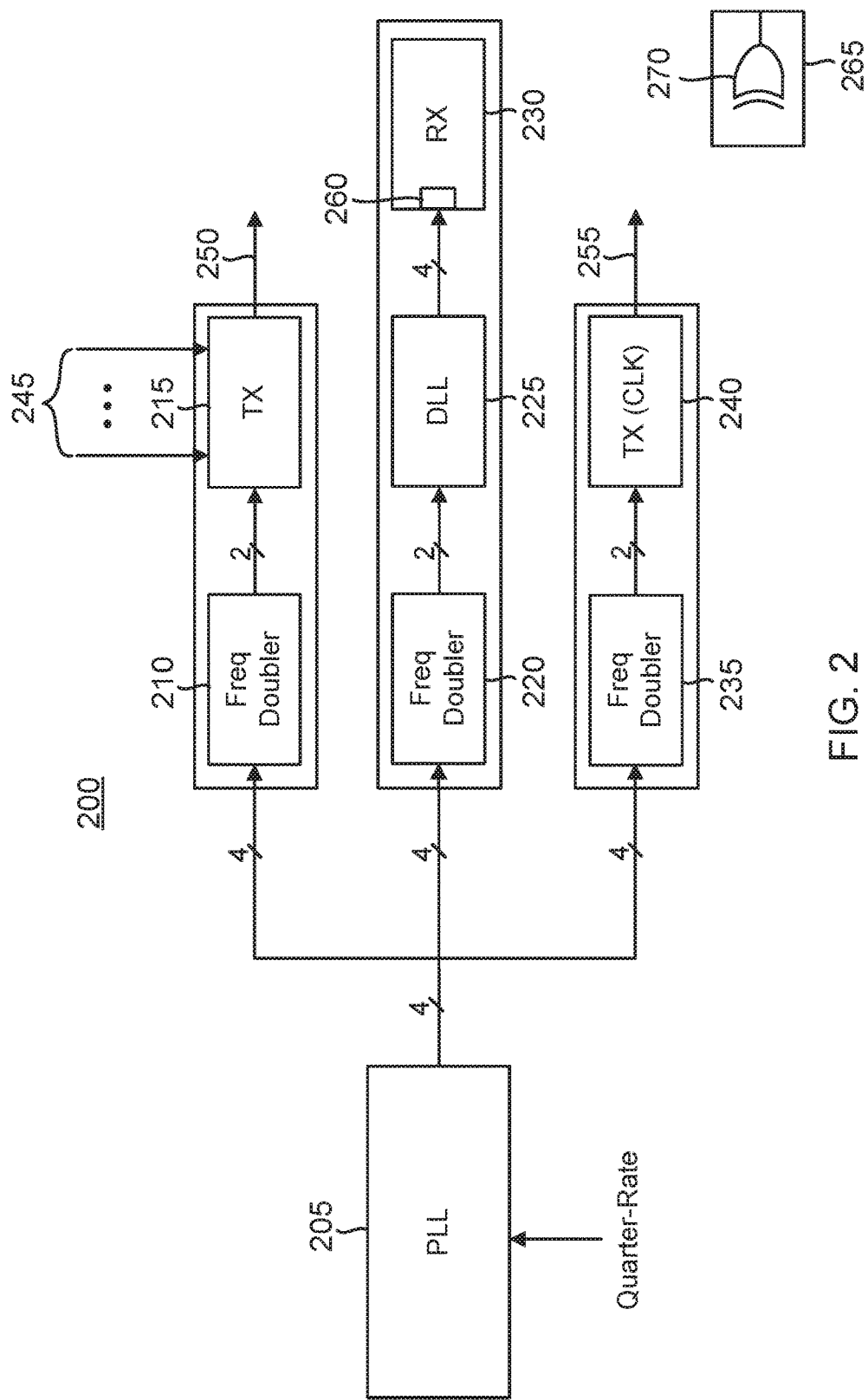
FIG. 2 is a diagram of a source synchronous SerDes architecture including a quarter-rate clock source in accordance with an aspect of the disclosure.

An example integrated circuit 200 including a source synchronous SerDes system is shown in FIG. 2. A PLL 205 functions to generate a quarter-rate clock signal and its quadrature as well as an inverse of the quarter-rate clock signal and a quadrature of the inverse of the quarter-rate clock signal. PLL 205 thus functions to generate four phases such that a phase shift of 0 degrees corresponds to the quarter-rate clock signal, a phase shift of 90 degrees corresponds to the quadrature of the quarter-rate clock signal, a phase shift of 180 degrees corresponds to the inverse of the quarter-rate clock signal, and a phase shift of 270 degrees corresponds to the quadrature of the inverse of the quarter-rate clock signal. Since these four clock signals are produced by PLL 205, its output line is shown as having a width of four.

The four clock phases are received by a frequency doubler 210 to produce a half-rate clock signal and its inverse. The output bus from frequency doubler 210 is thus illustrated as being two signals wide. The half-rate clock signal and its inverse are then received by a serializer transmitter 215 to serialize a parallel input data stream 245 into a serialized data stream 250. For example, transmitter 215 may be configured to sample the incoming bits on parallel input data stream 245 on the rising edge of the half-rate clock signal and also on the rising edge of the inverted half-rate clock signal. Alternatively, the sampling may be performed on the falling edges of the half-rate clock signal and of inverted half-rate clock signal. Serialized data stream 250 is thus transmitted at the full clock rate (four times the quarter-rate clock frequency used by PLL 205). The resulting SerDes architecture is quite advantageous. For example, suppose that the data rate for serialized data stream 250 is 20 GHz. The four quarter-rate clock signals from PLL 205 would then be 5 GHz clock signals, which are readily distributed even relatively long distances on respective leads on an integrated circuit die (e.g., up to a millimeter or more) with acceptable amounts of skew. Moreover, the power consumption of PLL 205 is then reduced as compared to a conventional half-rate PLL that would have to clock at 10 GHz to support a serial data stream at 20 GHz.

A clock transmitter 240 transmits a half-rate clock signal 255 for the transmission of serialized data stream 250. To generate the half-rate clock signal, a frequency doubler 235 doubles with respect to the four phases of the quarter-rate clock signal to produce half-rate clock signal 255 and its inverse. Transmitter 240 then functions to transmit half-rate clock signal 255 and its inverse. Note that in alternative implementations, transmitter 240 may instead merely transmit half-rate clock signal 255 instead of also transmitting its inverse. But the transmission of half-rate clock signal 255 in a differential form enables the cancellation of common-mode noise and establishes a well-defined return current path.

A deserializer receiver 230 includes a CDR circuit 260 that is configured to align a received clock (not illustrated) with the data eye for the received serial data stream (not illustrated) using four phases of a half-rate clock signal as discussed earlier. Alternatively, this alignment may be performed using just a half-rate clock signal and its quadrature in alternative implementations. A frequency doubler 220 doubles the four phases of the quarter-rate clock signal into a half-rate clock signal and its inverse. A delay-locked loop (DLL) 225 functions to generate the two additional phases for the half-rate clock using the half-rate clock signal and its inverse generated by frequency doubler 220. It will be appreciated that the frequency doublers disclosed herein may be implemented as XOR-gate-based frequency doublers as represented by an exclusive-or (XOR) gate 270 within a frequency doubler 265 shown in isolation in FIG. 2 for illustration clarity. In addition, each frequency doubler may be associated with a duty cycle correction circuit (discussed further below) for ensuring that each output clock from the frequency doubling has a 50-50 duty cycle.

Figure 3:
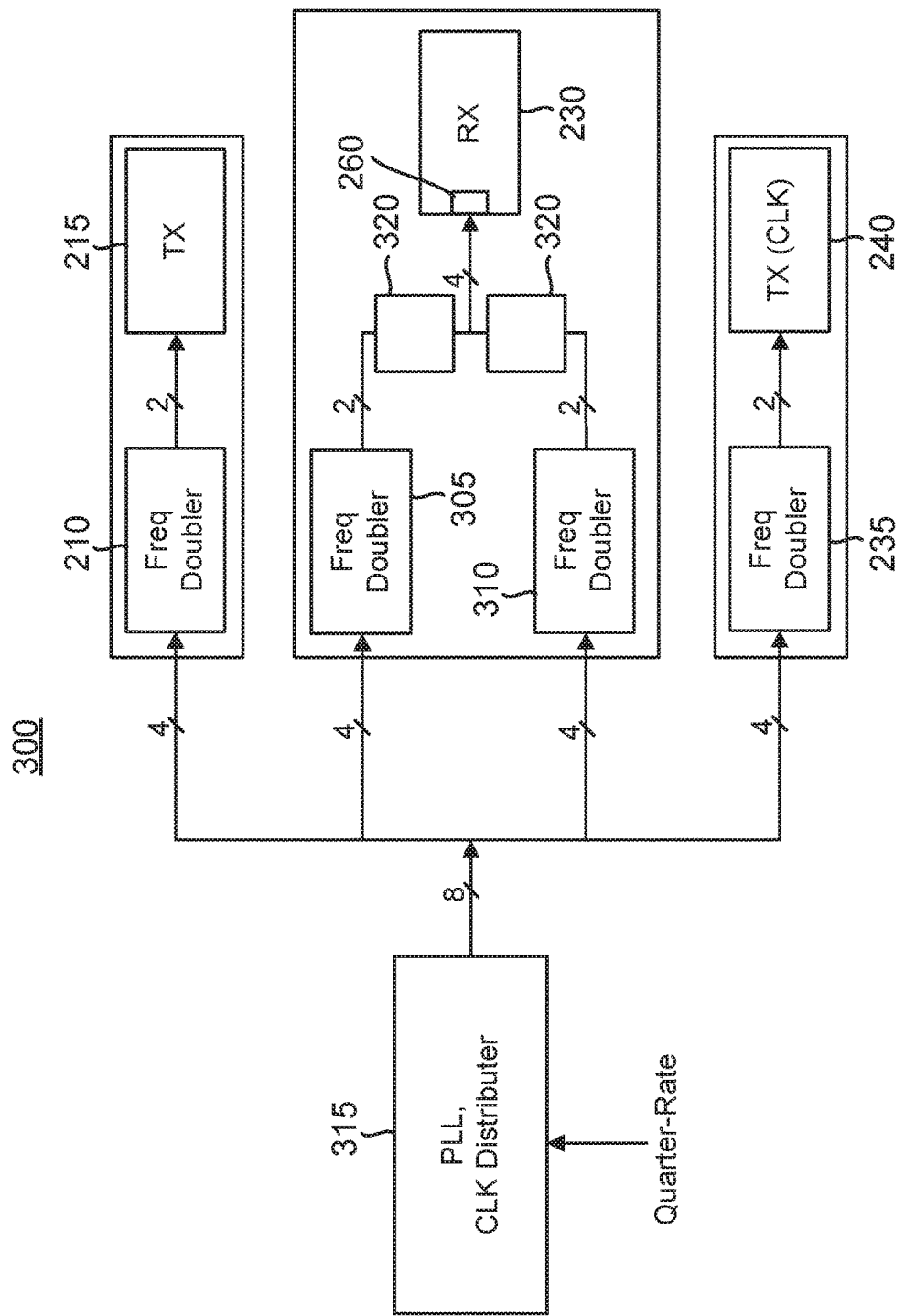
FIG. 3 is a diagram of the source synchronous SerDes architecture of FIG. 2 in which the receiver includes two frequency doublers in accordance with an aspect of the disclosure.

A source synchronous SerDes system 300 is shown in FIG. 3 in which a receiver 230 does not require a DLL to generate the four half-rate clock phases for CDR circuit 260. Instead, a PLL 315 functions to generate eight phases for a quarter-rate clock signal. For example, PLL 315 generates the 0°, 90°, 180°, and 270° versions of the quarter-rate clock signal discussed with regard to PLL 205. But PLL 315 also generates the quarter-rate clock signal in 45°, 135°, 225°, and 315° phase-shifted versions. A frequency doubler 305 receives one set of the quarter-rate clock signals (e.g., the 0°, 90°, 180°, and 270° versions) to generate a half-rate clock and its inverse. Similarly, a frequency doubler 310 receives the remaining set of the quarter-rate clock signals (e.g., the 45°, 135°, 225°, and 315° versions) to generate a quadrature half-rate clock signal and its inverse. In this fashion, receiver 230 may be clocked by the four phases of the half-rate clock signal without requiring a DLL.

Transmitter 215 and frequency doubler 210 function as discussed with regard to source synchronous SerDes system in integrated circuit 200 (FIG. 2). Frequency doubler 210 thus produces a half-rate clock signal and its inverse responsive to the four phases of the quarter-rate clock signal. For illustration clarity, parallel input data stream 245, serialized data stream 250, and half-rate clock signal 255 are not shown in FIG. 3. Clock transmitter 240 and frequency doubler 235 also function as discussed with regard to source synchronous SerDes system in integrated circuit 200. Note that frequency doublers 210 and 235 would each receive the same set of quarter-rate clock signals (either the 0°, 90°, 180°, and 270° set or the 45°, 135°, 225°, and 315° set) to generate the half-rate clock signal and its inverse. As noted earlier, the clock signals provided by each frequency doubler may have their duty cycle adjusted to a desired value such as a 50-50 duty cycle. For illustration clarity, only frequency doublers 305 and 310 are shown as being associated with a corresponding duty-cycle adjuster circuit 320 but it will be appreciated that the duty cycles for the remaining frequency doublers may be adjusted accordingly. In one implementation, each frequency doubler may be deemed to comprise a means for doubling the frequency of an input clock signal and its inverse to form an output clock signal and its inverse, wherein a frequency of the output clock signal is twice the frequency of the input clock signal.

Figure 4:
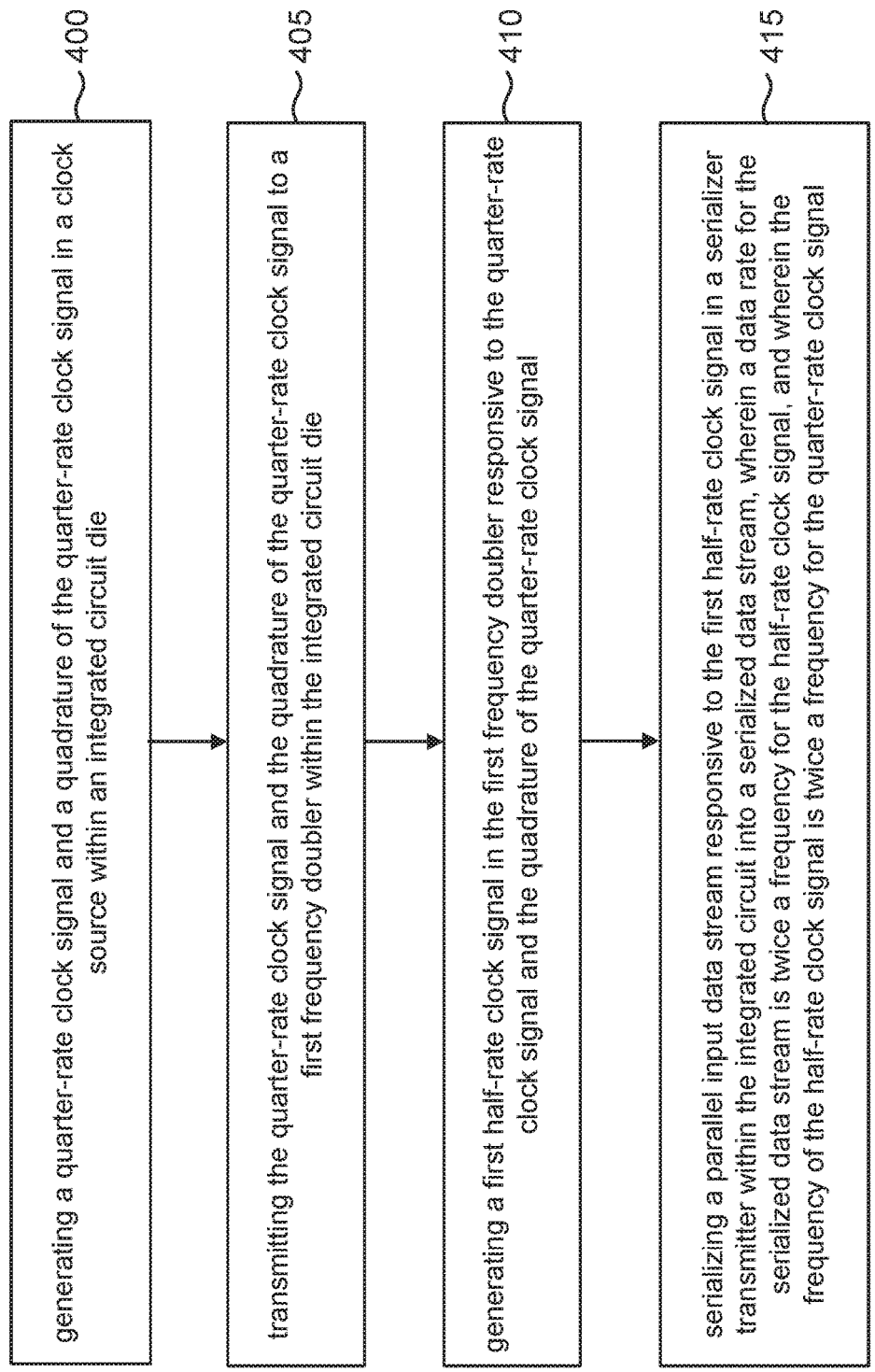
FIG. 4 is a flowchart for a method of use of a quarter-rate clock in a source synchronous SerDes system in accordance with an aspect of the disclosure.

A method of serializing a parallel input data stream will now be discussed with regard to the flowchart of FIG. 4. The method includes an act 400 of generating a quarter-rate clock signal and a quadrature of the quarter-rate clock signal in a clock source within an integrated circuit. The generation of the quarter-rate clock signals in PLLs 205 or 315 is an example of act 400. In addition, the method includes an act 405 of transmitting the quarter-rate clock signal and the quadrature of the quarter-rate clock signal to a first frequency doubler within the integrated circuit. The transmission of the quarter-rate clock signals from PLLs 205 or 315 to frequency doubler 210 or frequency doubler 235 is an example of act 405. Moreover, the method includes an act 410 of generating a first half-rate clock signal in the first frequency doubler responsive to the quarter-rate clock signal and the quadrature of the quarter-rate clock signal. The frequency doubling within frequency doubler 210 in source synchronous SerDes system in integrated circuit 200 or in source synchronous SerDes system 300 is an example of act 410. Finally, the method includes an act 415 of serializing a parallel input data stream responsive to the first half-rate clock signal in a serializer transmitter within the integrated circuit into a serialized data stream, wherein a data rate for the serialized data stream is twice a frequency for the first half-rate clock signal, and wherein the frequency of the first half-rate clock signal is twice a frequency for the quarter-rate clock signal. The serialization within transmitter 215 of FIGS. 2 and 3 is an example of act 415.

Note that the frequency doubling of a quarter-rate clock signal may be extended to form implementations in which a one-eighth-rate clock signal and its inverse are generated by a clock source such as a PLL. The frequency doubling discussed previously with respect to the transmitter, receiver, and clock transmitter would then be increased to a frequency quadrupling such that a frequency doubler is cascaded with another frequency doubler to perform the frequency quadrupling. It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A system, comprising:
a phase-locked loop (PLL) configured to generate a 0 degree phase quarter-rate clock signal, a 45 degree phase quarter-rate clock signal, a 90 degree phase quarter-rate clock signal, a 135 degree phase quarter-rate clock signal, a 180 degree quarter-rate clock signal, a 225 degree phase quarter-rate clock signal, a 270 degree phase quarter-rate clock signal, and a 315 degree phase quarter-rate clock signal;
a first frequency doubler configured to produce a first half-rate clock signal responsive to the 0 degree phase quarter-rate clock signal, the 90 degree phase quarter-rate clock signal, the 180 degree phase quarter-rate clock signal, and the 270 degree phase quarter-rate clock signal;
a second frequency doubler configured to produce a second half-rate clock signal and an inverse of the second half-rate clock signal responsive to the 0 degree phase quarter-rate clock signal, the 90 degree phase quarter-rate clock signal, the 180 degree phase quarter-rate clock signal, and the 270 degree phase quarter-rate clock signal;
a third frequency doubler configured to produce a third half-rate clock signal and an inverse of the third half-rate clock signal responsive to the 45 degree phase quarter-rate clock signal, the 135 degree phase quarter-rate clock signal, the 225 degree phase quarter-rate clock signal, and the 315 degree quarter-rate clock signal;
a receiver deserializer configured to deserialize a received serial data stream using an aligned clock from a clock data recovery (CDR) circuit, wherein the CDR circuit is configured to align the aligned clock responsive to the second half-rate clock signal, the inverse of the second half-rate clock signal, the third half-rate clock signal, and the inverse of the third half-rate clock signal; and
a serializer transmitter configured to serialize a parallel input data stream into a serialized data stream responsive to the first half-rate clock signal, wherein a data rate for the serialized data stream is twice a frequency for the first half-rate clock signal, and wherein the frequency for the first half-rate clock signal is twice a frequency for the 0 degree phase quarter-rate clock signal.

2. The system of claim 1, wherein the PLL, the first frequency doubler, and the serializer transmitter are integrated into an integrated circuit.

3. The system of claim 1, wherein the serializer transmitter is configured to sample the parallel input data stream responsive to both rising edges and falling edges for the first half-rate clock signal.

4. The system of claim 1, wherein the serializer transmitter is configured to sample the parallel input data stream responsive to rising edges of the first half-rate clock signal and to rising edges of the inverse of the first half-rate clock signal.

5. The system of claim 1, further comprising:
a fourth frequency doubler configured to produce a fourth half-rate clock signal and an inverse of the fourth half-rate clock signal responsive to the 0 degree phase quarter-rate clock signal, the 90 degree phase quarter-rate clock signal, the 180 degree phase quarter-rate clock signal, and the 270 degree phase quarter-rate clock signal; and
a clock transmitter configured to transmit the fourth half-rate clock signal and the inverse of the fourth half-rate clock signal.

6. The system of claim 1, wherein the first frequency doubler comprises an exclusive-or (XOR) gate.

7. The system of claim 1, further comprising a duty-cycle adjuster circuit configured to adjust a duty cycle for the first half-rate clock signal to equal a 50-50 duty cycle.

8. A method, comprising:

generating a 0 degree phase quarter-rate clock signal, a 45 degree phase quarter-rate clock signal, a 90 degree phase quarter-rate clock signal, a 135 degree phase quarter-rate clock signal, a 180 degree phase quarter-rate clock signal, a 225 degree phase quarter-rate clock signal, a 270 degree phase quarter-rate clock signal, and a 315 degree phase quarter-rate clock signal in a phase-locked loop within an integrated circuit;

transmitting the 0 degree phase quarter-rate clock signal, the 90 degree phase quarter-rate clock signal, the 180 degree phase quarter-rate clock signal, and the 270 degree phase quarter-rate clock signal to a first frequency doubler within the integrated circuit;

generating a first half-rate clock signal and an inverse of the first half-rate clock signal in the first frequency doubler responsive to the 0 degree phase quarter-rate clock signal signal, the 90 degree phase quarter-rate clock signal, the 180 degree phase quarter-rate clock signal, and the 270 degree phase quarter-rate clock signal;

serializing a parallel input data stream responsive to the first half-rate clock signal and the inverse of the first half-rate clocks signal in a serializer transmitter within the integrated circuit into a serialized data stream, wherein a data rate for the serialized data stream is twice a frequency for the first half-rate clock signal, and wherein the frequency of the first half-rate clock signal is twice a frequency for the 0 degree phase quarter-rate clock signal generating a second half-rate clock signal and an inverse of the second half-rate clock signal in a second frequency doubler in the integrated circuit responsive to the 0 degree phase quarter-rate clock signal, the 90 degree phase quarter-rate clock signal, the 180 degree phase quarter-rate clock signal, and the 270 degree phase quarter-rate clock signal;

generating a third half-rate clock signal and an inverse of the third half-rate clock signal in a third frequency doubler in the integrated circuit responsive to the 45 degree phase quarter-rate clock signal, the 135 degree phase quarter-rate clock signal, the 225 degree phase quarter-rate clock signal, and the 315 degree phase quarter-rate clock signal;

aligning an aligned clock signal in a clock data recovery circuit in the integrated circuit responsive to the second half-rate clock signal, the inverse of the second half-rate clock signal, the third half-rate clock signal, and the inverse of the third half-rate clock signal; and deserializing a received serial data stream using the aligned clock signal in a receiver deserializer in the integrated circuit.

9. The method of claim 8, wherein serializing the parallel input data stream comprises sampling the parallel input data stream responsive to both rising edges and falling edges of the first half-rate clock signal.

10. The method of claim 8, wherein the 0 degree phase quarter-rate clock signal is a 5 GHz clock signal, and wherein the data rate is 20 GHz.

* * * * *